US006969448B1

(12) United States Patent
Lau

(10) Patent No.: US 6,969,448 B1
(45) Date of Patent: Nov. 29, 2005

(54) METHOD FOR FORMING A METALLIZATION STRUCTURE IN AN INTEGRATED CIRCUIT

(75) Inventor: Gorley L. Lau, Fremont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 816 days.

(21) Appl. No.: 09/476,669

(22) Filed: Dec. 30, 1999

(51) Int. Cl.[7] .......................... C23C 14/34; H01L 21/44
(52) U.S. Cl. .................................. 204/192.17; 438/688
(58) Field of Search ...................... 204/192.15, 192.22, 204/192.25, 192.17; 438/648, 688

(56) References Cited

U.S. PATENT DOCUMENTS

| | | |
|---|---|---|
| 4,970,176 A | 11/1990 | Tracy et al. |
| 5,108,570 A | 4/1992 | Wang |
| 5,108,951 A | 4/1992 | Chen et al. |
| 5,270,255 A | 12/1993 | Wong |
| 5,288,665 A | 2/1994 | Nulman |
| 5,358,616 A | 10/1994 | Ward |
| 5,371,042 A | 12/1994 | Ong |
| 5,378,660 A | 1/1995 | Ngan et al. |
| 5,443,995 A | 8/1995 | Nulman |
| 5,600,182 A | 2/1997 | Schinella et al. |
| 5,658,828 A | 8/1997 | Lin et al. |
| 5,665,659 A | 9/1997 | Lee et al. |
| 5,693,564 A | 12/1997 | Yu |
| 5,731,245 A | 3/1998 | Joshi et al. |
| 5,882,488 A * | 3/1999 | Leiphart ................. 204/192.32 |
| 5,962,923 A * | 10/1999 | Xu et al. ..................... 257/774 |
| 5,985,759 A | 11/1999 | Kim et al. |
| 6,045,666 A * | 4/2000 | Satitpunwaycha et al. ..................... 204/192.15 |
| 6,080,665 A | 6/2000 | Chen et al. |
| 6,093,654 A | 7/2000 | Koyama |
| 6,156,645 A * | 12/2000 | Geha et al. .................. 438/648 |
| 6,176,983 B1 * | 1/2001 | Bothra et al. .......... 204/192.17 |
| 6,177,350 B1 * | 1/2001 | Sundarrajan et al. ....... 438/688 |
| 6,217,721 B1 * | 4/2001 | Xu et al. ................ 204/192.17 |

OTHER PUBLICATIONS

S.M. Rossnagel et al. "Metal ion depisiton from ionized magnetron sputtering discharge", J. vac Sci. Technol. B 12(1), pp 449-453, Jan. 1994.*

S.M. Rossnagel et al. "Magnetron sputter deposition with high levels of metal ionization", Appl. Phys. Lett. 63 (24), pp 3285-3287, Dec. 1993.*

Xu et al., "Plar Multilevel Metallization Technologies for ULSI Devices," SPIE vol. 2335, 1994, pp. 70-79.

Xu et al., "Al planarization processes for multilayer metallization of quarter micrometer devices," Thin Solid Films, vol. 253, 1994, pp. 367-371.

Singer, "The Interconnect Challenge: Filling Small, High Aspect Ratio Contact Holes," Semiconductor International, Aug. 1994, 5 pages.

Robinson, "Al hits sub-0.25 micron vias," pp. 37 and 42, Electronic Engineering Times, Issue 939, Feb. 1997.

(Continued)

Primary Examiner—Gregg Cantelmo
(74) Attorney, Agent, or Firm—Kevin L. Daffer; Mollie E. Lettang; Daffer McDaniel, LLP

(57) ABSTRACT

A method for fabricating a metallization structure is presented. The method preferably includes ion metal plasma depositing a wetting layer within a cavity defined in a dielectric layer. The wetting layer preferably includes titanium. The method preferably further includes sputter depositing a bulk metal layer within the cavity and upon the wetting layer. Sputter depositing of the bulk metal layer is preferably performed in a single deposition chamber at least until the cavity is substantially filled.

21 Claims, 6 Drawing Sheets

OTHER PUBLICATIONS

Metal Deposition Products, Applied Materials-Products and Services, 5 pages, printed Nov. 1999, © 1999 Applied Materials, Inc.

"Ionized Physical Vapor Deposition," printed Dec. 1999, www.ece.neu.edu/edsnu/hopwood, 8 pages.

* cited by examiner

METHOD FOR FORMING A METALLIZATION STRUCTURE IN AN INTEGRATED CIRCUIT

BACKGROUND OF THE INVENTION

1. Field of the Invention

This invention relates to integrated circuit fabrication and, more particularly, to methods for forming metallization structures.

2. Description of the Related Art

The information described below is not admitted to be prior art by virtue of its inclusion in this Background section.

An integrated circuit includes numerous active and passive devices arranged upon and within a single substrate. In order to implement desired circuit functions, select devices or components of the integrated circuit must be interconnected. Metallization structures are often used to interconnect integrated circuit components. Metallization structures may be generally subdivided into two categories: laterally extending interconnect lines and vertically extending contacts or plugs. Interconnects are relatively thin lines of conductive material that largely extend parallel to the underlying devices. As the name implies, contacts are the metallization structures that actually contact the devices of the integrated circuit. Plugs mostly extend vertically between metallization levels.

Within each level of interconnect, metallization structures are separated from other structures on underlying or overlying levels, and from structures within the same metallization level, by dielectric materials. The dielectric materials prevent unwanted communication between separated metallization structures. In large part because of the difficulty in etching many metallization materials, metallization structures are often formed by first depositing the dielectric material which will separate the metallization structures and then patterning cavities in the dielectric material (i.e., metallization cavities) for the metallization structures. The metallization cavities patterned for interconnect structures are typically called trenches, and the metallization cavities patterned for plugs are typically called vias. Once the cavities are formed, metals can then be deposited in the cavities to form metallization structures. If necessary, the deposited metal can be planarized, a process that often involves chemical-mechanical polishing (CMP).

Despite the name, metallization structures are not required to actually be metals, but may instead be fabricated from any material sufficiently conductive to transmit an electrical signal (e.g., doped polysilicon, metal silicides, refractory metal nitrides). For metallization structures above the level of local interconnect, though, metals are the predominant metallization materials, and one of the most common metallization materials is aluminum. Aluminum is desirable as a metallization material because of, among other things, its relatively low resistance and good current-carrying density.

Aluminum is usually deposited using physical vapor deposition (PVD). PVD processing may also be known as sputter deposition, or sputtering. In general, sputter deposition may be considered any deposition process in which a material is deposited by sputtering the material from, e.g., a target composed of the material to be deposited. A typical method for sputtering a metal onto a substrate includes introducing an inert gas into a deposition chamber and forming a plasma that ionizes the inert gas by applying a potential between the substrate and the target. The ionized inert gas atoms are then attracted toward the target, and collide with the target with such force that atoms of the target are sputtered off. The sputtered atoms may then deposit on the substrate.

Sputtering can be used to deposit any variety of materials, including conductors, non-conductors, and high melting point compounds. Sputtering is advantageous because it may provide for good step coverage and accurate transfer of material composition from the target to the deposited metal. This last feature is particularly helpful when depositing alloys.

One process for forming a metallization structure incorporating aluminum involves first sputter depositing a titanium wetting layer into the cavity in which the metallization structure will be contained. The titanium wetting layer lines the sidewalls and base of the cavity. A bulk metal layer of aluminum is then sputter deposited onto the wetting layer to fill the cavity. The titanium wetting layer helps to minimize or avoid agglomeration of the aluminum layer and provides for continuous metal coverage along the sidewalls and bottom of a cavity. In general, an effective wetting layer allows a subsequent bulk metal layer to be deposited more smoothly, and thus with higher quality.

Wetting layers are often deposited by standard sputtering processes, which may be considered to be that group of sputtering processes that do not impart any significant degree of directionality to the sputtered atoms. Standard sputtering processes thus allow sputtered atoms to contact the deposition surface at a variety of angles ranging from almost parallel to perpendicular. Standard sputtering processes, however, are unable to suitably deposit a wetting layer in small (i.e., narrow absolute width), high aspect ratio (i.e., cavity depth divided by the cavity width) cavities. The ability of a standard sputtering process to deposit an effective wetting layer is greatly affected by the width and aspect ratio of the cavity into which deposition is to occur. Generally speaking, the smaller the opening of the cavity, the less likely that high impact angle atoms will actually enter the cavity. So as aspect ratios increase, and as cavity openings become more narrow, the high quantity of high impact angle (e.g., those atoms having impact angles further away from perpendicular) atoms deposited in standard sputtering processes only increases the difficulty these processes often have in depositing effective wetting layers.

In an attempt to resolve this problem, many processes have implemented collimated sputtering processes when depositing a wetting layer. Generally speaking, collimated sputtering processes use a collimator arranged between the target and the substrate to block high impact angle atoms while allowing lower impact angle atoms (e.g., those atoms having impact angles closer to perpendicular) to pass through. As a result, collimated sputtering processes can be used to deposit adequate wetting layers in higher aspect ratio cavities than is possible with standard sputtering processes.

Collimated sputtering processes, however, are limited in that they only filter out high impact angle atoms, and as such do not impart significant directionality to the sputtered atoms that pass through the collimator. While providing improved performance over standard sputtering processes, collimated sputtering processes may also be unable to deposit an adequate wetting layer in narrow cavities having relatively large aspect ratios. As aspect ratios continue to increase and cavity openings continue to narrow, an adequate wetting layer cannot be formed using standard sputtering or collimated sputtering processes. Unfortunately, if an adequate wetting layer cannot be formed, a bulk metal layer (e.g., one composed of aluminum) deposited in the cavity may not have the desired quality. Consequently, the ability of such a metallization structure to transmit electrical signals may be impaired, or even destroyed.

Therefore, it would be desirable to develop an improved metallization structure and method for forming such a structure. The desired structure and method should be one that embodies an effective wetting layer even in cavities having high aspect ratios.

SUMMARY

The problems described above may be in large part resolved by an improved metallization structure, and method for fabricating such a structure. The method preferably includes ion metal plasma depositing a wetting layer within a cavity defined in a dielectric layer. The wetting layer preferably includes titanium. The method preferably further includes sputter depositing a bulk metal layer within the cavity and upon the wetting layer. Sputter depositing of the bulk metal layer is preferably performed in a single deposition chamber at least until the cavity is substantially filled. The method preferably enables deposition of an adequate wetting layer even in narrow cavities having high aspect ratios.

Broadly speaking, ion metal plasma deposition processes include those sputtering processes in which metal atoms sputtered from a target are ionized and then directed toward a deposition surface in a direction substantially perpendicular to the deposition surface. Preferably, the method includes ion metal plasma depositing a wetting layer having titanium within the cavity defined in a dielectric layer by sputtering metal atoms from the target and towards a pedestal above which the dielectric layer is positioned. The metal atoms are then ionized before they reach the pedestal by passing the metal ions through a plasma generated within the chamber (e.g., by an ionizing element). The metal atoms are then directed toward the dielectric layer in a direction substantially perpendicular to the dielectric layer (i.e., perpendicular to the base of the cavity). This ability to deposit metal ions in a highly directional manner preferably allows the present process to deposit a wetting layer having excellent step coverage, even in small, high aspect ratio metallization cavities (e.g., contacts, vias, or trenches).

The present process preferably enables the formation of a high quality metallization structure in smaller, higher aspect ratio cavities than conventional processes without requiring the incorporation of overly complicated, multiple-chamber bulk metal layer deposition processes. In response to the difficulty that conventional metallization structure formation processes have with small, high aspect ratio cavities, some manufacturers have resorted to using overly complex methods for depositing the bulk metal layer. Some of these methods require multiple chambers for deposition of the bulk metal layer, which may substantially increase the total cost of the metallization process. But because the present process may form a more effective wetting layer in small, high aspect ratio cavities than is possible with conventional methods, such overly complicated methods for depositing a bulk metal layer are not required. That is, the present process may form a quality metallization structure in small, high aspect ratio cavities incapable of being adequately filled by conventional sputter deposition processes even when the bulk metal layer is sputter deposited in a single chamber. This benefit may arise because once an effective wetting layer as formed herein is present, the bulk metal layer deposition processes of the present method may not have to possess the same degree of directionality as the ion metal plasma deposition processes used to deposit the wetting layer. Consequently, the present process may obtain desired process goals without requiring the acquisition and use of overly complicated bulk metal layer deposition processes and equipment, and without suffering the possible extension in overall processing time and cost that may result from forming a bulk metal layer in more than one deposition chamber.

Furthermore, the present method may allow for a simplified chamber configuration. The manner of depositing a wetting layer having titanium as described herein may be effectively used with several separate metallization processes having a variety of processing goals. Consequently, a chamber configured to carry out a wetting layer deposition process as described herein may be used in several different processing flows, thus potentially eliminating the need to have several types of chambers for the sputter deposition of a metal layer incorporating titanium. This is especially important when trying to most effectively configure a multichamber cluster system.

Moreover, the particular process parameters selected for ion metal plasma deposition presented herein may significantly assist in the formation of a quality wetting layer in small, high aspect ratio cavities. There are numerous parameters that can affect the outcome of an ionized metal plasma deposition process. Each of the parameters, and particularly the various powers applied during deposition, must be properly balanced in order to obtain a desired product. Changing one of the parameters without appropriately compensating the others appropriately can unexpectedly and unpredictably impair, or even prevent, the achievement of process goals (e.g. high via fill yield). Consequently, the selection of appropriate parameters for an ion metal plasma deposition process as provided herein should not be considered routine optimization.

Along these lines, the process parameters of the present ion metal plasma deposition process are preferably selected to produce a wetting layer of optimal quality in small, high aspect ratio cavities. To accomplish this goal, the power parameters of the wetting layer deposition process are preferably selected to (1) maintain enough sputtered metal neutrals for good sidewall coverage, (2) generate sufficient metal ions with sufficient impact energy to prevent metal build-up (and subsequent shadowing of the lower sidewalls) on the tapered portions of the cavity sidewalls, and (3) resputter the bottom of a cavity to improve lower sidewall coverage.

After a wetting layer of the desired thickness has been formed, the microelectronic topography may be transported from the wetting layer deposition chamber into a bulk metal layer deposition chamber. Transport of the microelectronic topography between chambers is preferably done under high vacuum. More preferably, the microelectronic topography is immediately transferred to the bulk metal deposition chamber after deposition of the wetting layer is complete. In any case, the bulk metal layer deposition is preferably the first metal deposition process performed on the microelectronic topography after depositing the wetting layer. That is, while other processing steps may be performed between depositing the wetting layer and depositing the bulk metal layer (e.g., cleaning processes), there are preferably no intervening processes in which a metal layer is deposited.

Sputter depositing the bulk metal layer preferably includes sputter depositing, within a single chamber, substantially the entirety of the bulk metal layer. That is, substantially the entirety of a bulk metal layer used to form a substantially contiguous metallization structure (e.g., an interconnect line and underlying plug in a dual-Damascene scheme) is preferably sputter deposited in a single chamber. Preferably, the bulk metal layer is deposited by cold sputter depositing a first portion of the bulk metal layer within the cavity in the dielectric layer and subsequently hot sputter depositing a second portion of the bulk metal layer within the cavity. Generally speaking, cold sputter deposition processes deposit a material at a temperature such that the deposited material, upon deposition, cannot significantly reflow, and hot sputter deposition processes deposit the material at a temperature such the deposited material, upon deposition, can significantly reflow. Reflow of hot sputter deposited materials may result from solid phase and surface diffusion, possibly driven by capillary forces. Reflow may be aided by the thermal energy imparted by the impact of subsequently deposited atoms. "Significant reflow" may encompass only those forms of bulk redistribution of a metal that occur at elevated temperatures. A wetting layer deposited as described herein may be especially suitable for use as a wetting layer for bulk metal layer incorporating aluminum and at least partially deposited by hot sputtering processes.

In a preferred embodiment, the first portion of the bulk metal layer may be deposited above, and more preferably is deposited directly upon, the wetting layer both within and outside of the cavity. Alternatively, a cavity need not be employed. Absent a cavity, the bulk metal layer may be deposited upon the wetting layer, and thereafter both layers are preferably patterned using, e.g., photolithography. Regardless of how the metallization structure is formed (i.e., trench fill possibly followed by CMP or blanket deposition followed by photolithography), the first portion of the bulk metal layer is preferably deposited by cold sputter deposition such that immediately after being deposited, the first portion of the bulk metal layer is not configured to significantly reflow. That is, while it may be made to reflow subsequently, it is preferably not configured for or capable of reflowing immediately after being deposited. If a cavity is used, the first portion of the bulk metal layer preferably does not fill the cavity after being deposited.

The second portion of the bulk metal layer may be deposited above, and more preferably directly upon, the first portion of the bulk metal layer. If a cavity is used, the bulk metal layer is deposited both within and outside of the cavity. The second portion of the bulk metal layer is preferably deposited by hot sputter deposition such that immediately after being deposited, the first portion of the bulk metal layer is configured to significantly reflow. That is, it is preferably deposited at a temperature sufficiently high that it may be capable of reflowing immediately after being deposited. The second portion of the bulk metal layer is preferably deposited such that it substantially fills the cavity. The second portion of the bulk metal layer is preferably deposited such that at least after reflowing of the bulk metal layer has stopped, the upper surface of the bulk metal layer is preferably substantially planar.

A metallization structure is also presented. The metallization structure preferably includes a wetting layer arranged in a cavity. The wetting layer preferably provides excellent sidewall and base coverage of the cavity. The sidewall coverage of the wetting layer may be considered to be the ratio of the thickness of the wetting layer along the sidewalls of the cavity to the thickness of the wetting layer above a surface (preferably of the dielectric layer in which the cavity is defined) adjacent to the cavity. Likewise, the base coverage of the wetting layer may be considered to be the ratio of the thickness of the wetting layer above the base of the cavity to the thickness of the wetting layer above a surface (preferably of the dielectric layer in which the cavity is defined) adjacent the cavity. In an embodiment, the wetting layer may have a sidewall coverage of at least 10%, and is more preferably at least 25%. The wetting layer may also have a base coverage of at least 50%, and more preferably at least 60%. The coverage percentages are preferably based on average thicknesses.

The wetting layer preferably also has a substantially uniform thickness upon the base of a cavity arranged within a dielectric layer. That is, the thickness of the wetting layer preferably does not vary significantly along the base of the cavity. In an embodiment, the thickness of the wetting layer may vary by less than 10% along the base of the cavity.

The cavity preferably has an aspect ratio of at least 2:1, and more preferably of at least 3:1. In some instances, and given proper filling conditions, a cavity having an aspect ratio of 4:1, and possibly greater than 5:1 can be filled. The cavity preferably has a width of at most 0.40 microns, and more preferably a width of at most 0.25 microns. A bulk metal layer containing aluminum is preferably configured upon the wetting layer and substantially fills the cavity. Preferably, the bulk metal layer is substantially void-free.

BRIEF DESCRIPTION OF THE DRAWINGS

Other objects and advantages of the invention will become apparent upon reading the following detailed description and upon reference to the accompanying drawings in which.

Figure 1:
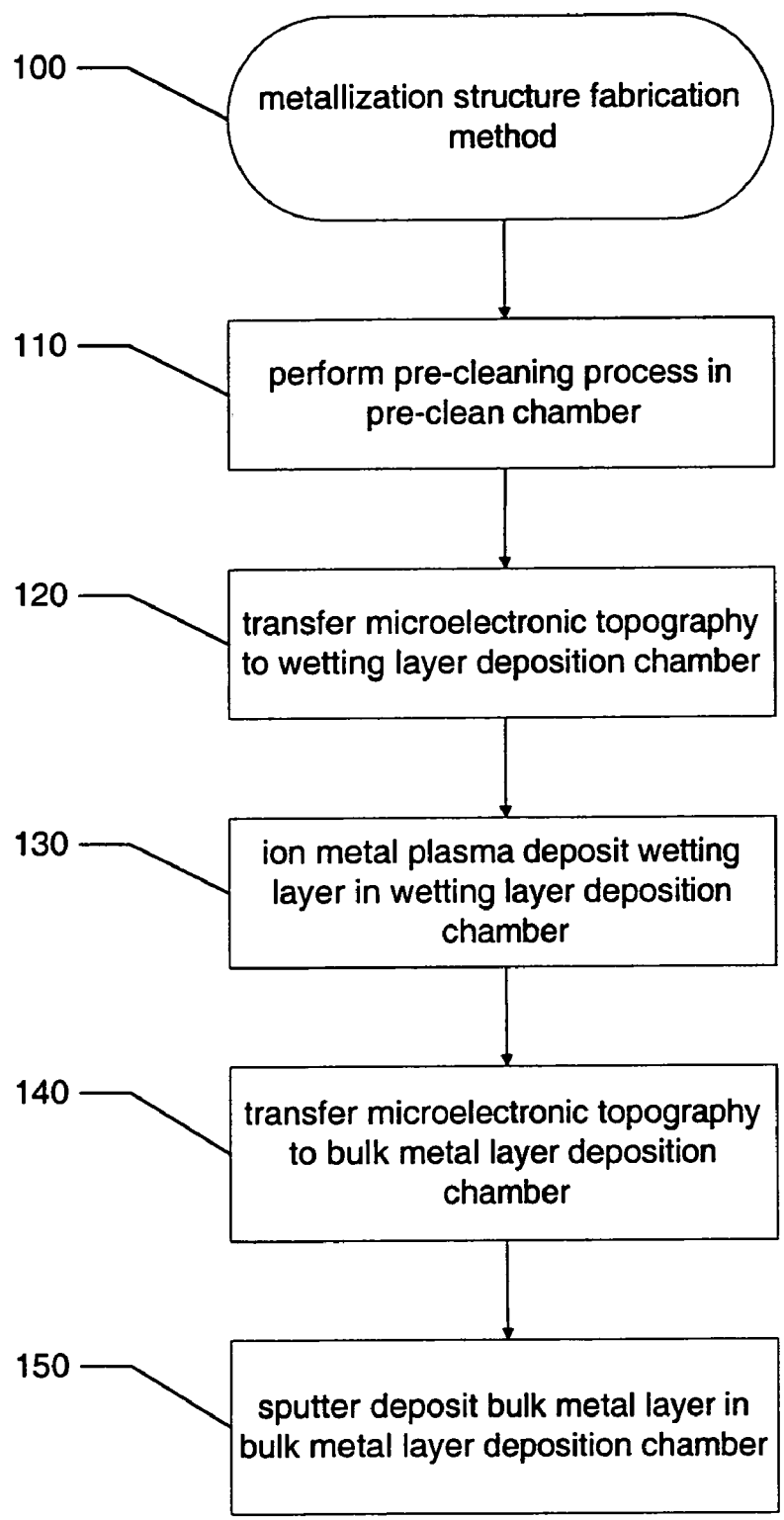
FIG. 1 is flow diagram of a metallization structure fabrication method in accordance with an embodiment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

FIG. 1 presents a flow chart of a method for fabricating a metallization structure in accordance with a preferred embodiment. Metallization structure fabrication method 100 illustrates a preferred embodiment of the present method. While there may be any number of processing steps performed before and after the steps shown in method 100, method 100 preferably includes a preliminary step 110 of performing a pre-cleaning process.

Figure 4:
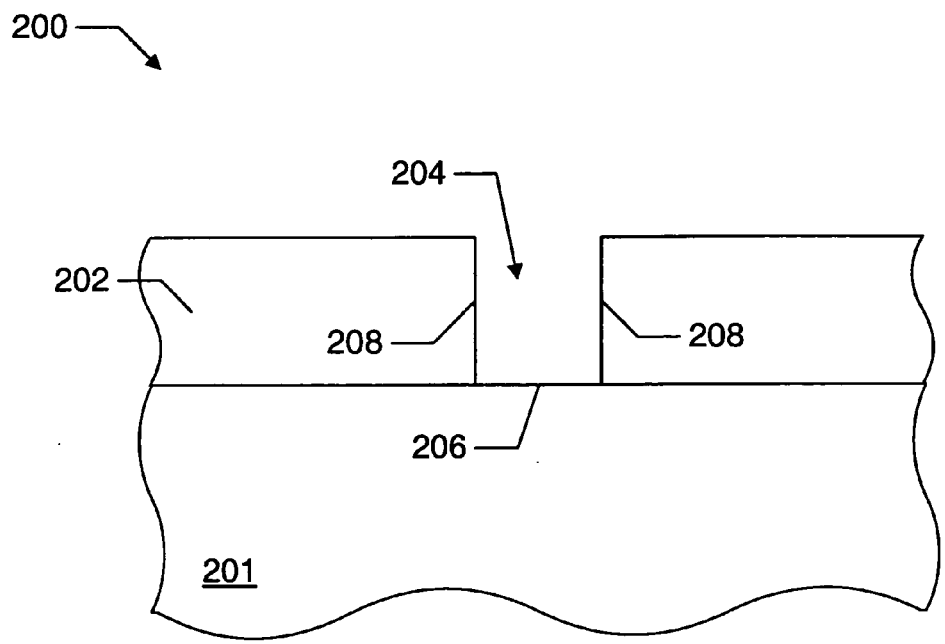
FIG. 4 is a partial cross-sectional view of a microelectronic topography, in which a dielectric layer having a cavity defined therein is arranged above a lower portion of the microelectronic topography in accordance with an embodiment.

In FIG. 4, however, a cross-sectional view of a microelectronic topography suitable for use in an embodiment is shown as configured before performing step 110. Microelectronic topography 200 is shown with a dielectric layer 202 arranged above a lower portion 201 of the microelectronic topography. Microelectronic topography lower portion 201 may include a substrate and any layers and materials formed above the substrate from which microelectronic products (e.g., semiconductor devices) may be produced. Preferably, microelectronic topography lower portion 201 includes a semiconductor substrate, and more preferably a lightly doped, single-crystal silicon substrate. Active devices, such as MOS transistors, may be arranged upon and within the semiconductor substrate. The active devices may be isolated from each other using isolation structures. In an alternate embodiment, microelectronic topography lower portion 201 may include a substrate composed of a non-semiconducting material. Such non-semiconducting materials may include metals and ceramics.

Dielectric layer 202 is preferably arranged upon microelectronic topography lower portion 201. Dielectric layer 202 is preferably is composed of a material suitable for insulating metallization structures in integrated circuit fabrication. Dielectric layer 202 may serve as a topography for receiving subsequently deposited metal layers that can then be patterned. Alternatively, the dielectric layer 202 can be partially or completely removed in localized areas to form a via or "cavity". Dielectric layer 202 is shown as being composed of a material that can be patterned to form a metallization cavity and into which metals can be sputter deposited (and possibly planarized) to form a metallization structure, such as in a Damascene or dual-Damascene process. Suitable materials may include silicon dioxide (including fluorinated silicon oxides), silicon oxynitride, and several low dielectric constant materials. Several layers of materials not shown may exist between 202 dielectric layer and a substrate of microelectronic topography lower portion 201.

Cavity 204 is preferably defined in dielectric layer 202. Dielectric layer 202 preferably includes cavity sidewalls 208 arranged around the cavity. Cavity sidewalls 208 are preferably substantially vertical. Cavity 204 may extend from an upper surface of 202 dielectric layer to an upper surface of microelectronic topography lower portion 201 (i.e., cavity base 206). In an embodiment, cavity 204 may be configured as a via defined within the dielectric layer and extending to a conductive region of microelectronic topography lower portion 201. The conductive region may be, e.g., an underlying interconnect line or a conductive region of a device, such as a source/drain region of a semiconductor substrate. Cavity 204 preferably has an aspect ratio of at least 2:1, and more preferably of at least 3:1. Cavity 204 preferably has a width of at most 0.40 microns, and more preferably has a width of at most 0.25 microns.

Figure 5:
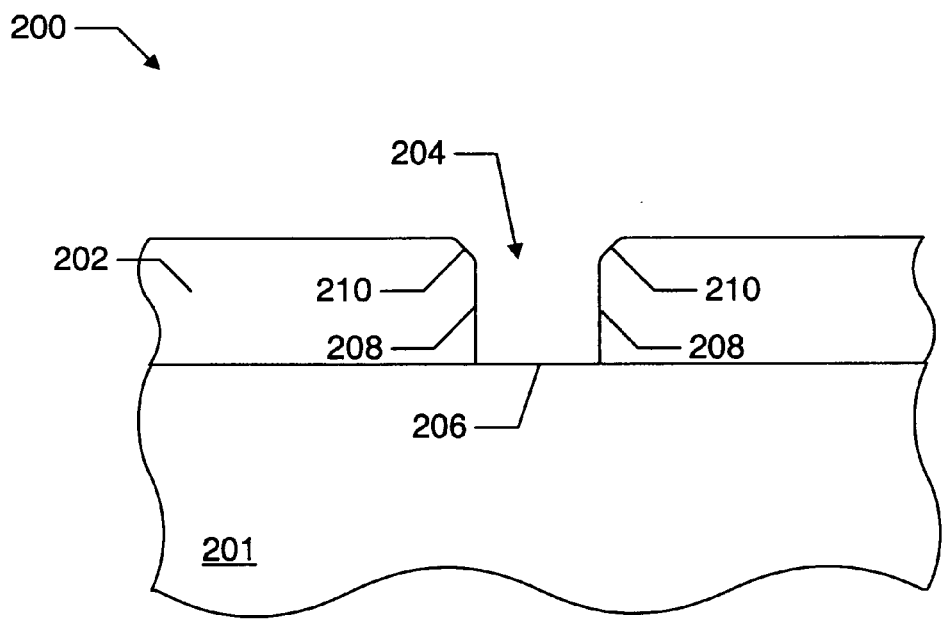
FIG. 5 is a partial cross-sectional view of the microelectronic topography, in which a pre-cleaning process sputters away an upper portion of the dielectric layer and tapers upper sidewalls of the cavity according to a processing step subsequent to FIG. 4.

FIG. 5 presents a cross-sectional view of microelectronic topography 200 after performing pre-cleaning process 110. Pre-cleaning process 110 is preferably performed before depositing any metallic layers within cavity 204. Performing pre-cleaning process 110 preferably includes sputtering away an upper portion of dielectric layer 202, thus removing contamination configured upon an upper surface of the dielectric layer. Sputtering of the upper portion of dielectric layer 202 may be accomplished by inducing ionized argon atoms to impact the upper surface of dielectric layer 202 with sufficient energy to sputter away an upper portion of the dielectric layer 202. Sputtering of the dielectric layer during the pre-cleaning process preferably sputters away an upper portion of cavity sidewalls 208 such that cavity sidewall portions 210 become tapered. By tapering or "rounding off" upper portions 210 of the cavity sidewalls, the ability of any subsequently hot deposited aluminum to reflow into cavity 204 may be increased. This benefit may arise because tapering of cavity sidewall upper portions 210 provides the aluminum with a sloped entry point into cavity 204, which is believed to aid in reflowing of the aluminum into the cavity. Pre-cleaning process 110 preferably sputters away 200–250 angstroms of dielectric material from the upper portion of dielectric layer 202. The amount of sputtering is preferably controlled such that while upper portions 210 of cavity sidewalls 208 are tapered, upper portions 210 are not tapered to an inordinate extent (e.g., to an extent where they contribute to unwanted metal shadowing of the lower cavity sidewalls.)

In an embodiment, pre-cleaning process 110 may be performed in a sputter etch chamber. A sputtering gas, preferably an inert gas such as argon, may be introduced into the chamber. A plasma power is preferably applied to an ionizing element of the chamber sufficient to ionize the sputtering gas ions. (The quantity of ions generated may be controlled by the amount of this power.) A bias power may be applied to the pedestal upon which the microelectronic topography is situated sufficient to draw ions toward the topography for sputtering the topography. (The bias power may control how hard these ions contact the topography.) By appropriately configuring these parameters, a desired etch rate of dielectric layer 202 can be achieved.

Referring back to FIG. 1, microelectronic topography 200 is preferably transferred to a wetting layer deposition chamber (step 120) after pre-cleaning process 110 is complete. Transfer of the microelectronic topography between the pre-cleaning chamber and the wetting layer deposition chamber, and between two chambers in general in an embodiment, preferably is performed under high vacuum (e.g., $10^{-9}$ torr). The wetting layer may then be ion metal plasma deposited into the cavity (step 130).

Figure 6:
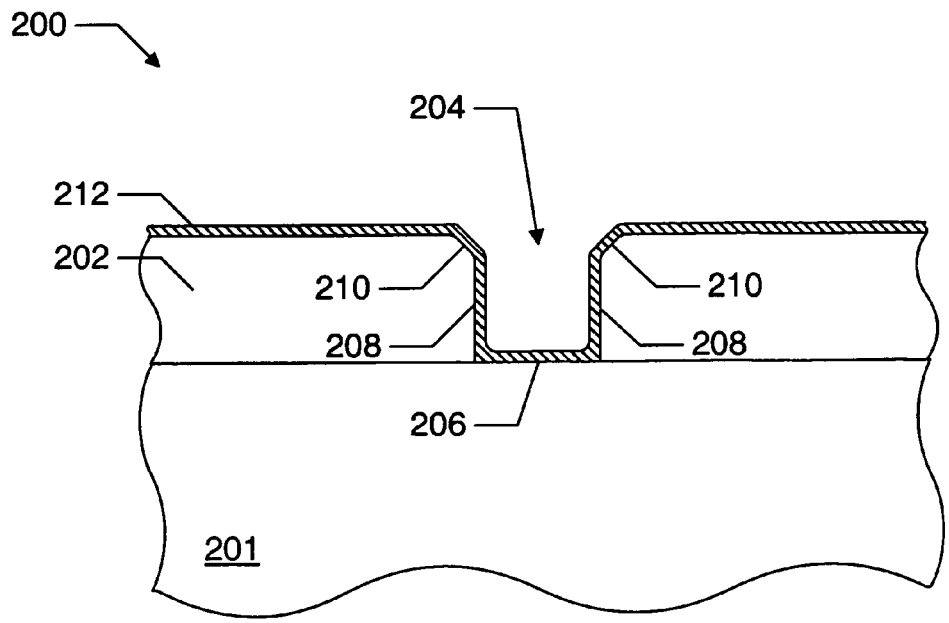
FIG. 6 is a partial cross-sectional view of the microelectronic topography, in which a wetting layer is ion metal deposited within the cavity and upon the dielectric layer according to a processing step subsequent to FIG. 5.

FIG. 6 presents a cross-sectional view of the microelectronic topography after ion metal plasma deposition of a wetting layer into the cavity. Wetting layer 212 is preferably deposited on the sidewalls 208 of cavity 204 and the upper surface of dielectric layer 202 outside of cavity 204. In addition, wetting layer 212 is preferably deposited on the tapered portions 210 of the cavity sidewalls. Wetting layer 212 may further be deposited on the upper surface of microelectronic topography lower portion 201 that is exposed by the cavity (cavity base 206). Alternately, if there are any layers already upon cavity sidewalls 208 and/or 210, cavity base 206, and/or the upper surface of dielectric layer 202, than wetting layer 212 may be deposited on those layers instead. The coverage of wetting layer 212 over the cavity sidewalls and base, including the tapered portions of the cavity sidewalls, is preferably substantially even. Stated otherwise, wetting layer 212 preferably has a substantially uniform thickness upon the base of cavity 204. That is, the thickness of wetting layer 212 preferably does not vary significantly along the base of the cavity. In an embodiment, the thickness of wetting layer 212 may vary by less than 10% along the base of cavity 204. As stated above, wetting layer 212 preferably provides excellent sidewall and base coverage of cavity 204. In an embodiment, wetting layer 212 may have a sidewall coverage of at least 10%, and is more preferably of at least 25%. The wetting layer may also have a base coverage of at least 50%, and more preferably of at least 60%.

Wetting layer 212 preferably is primarily composed of titanium. (As set forth herein, "primarily" when used in terms of composition as in "primarily composed," "primarily includes," or "primarily comprises" is intended to indicate that the referenced material the largest single component on a molar basis of whatever the phrase is referring to). More preferably, wetting layer 212 is composed of relatively pure titanium (i.e., the wetting layer consists essentially of titanium) or a high titanium percentage titanium alloy. Wetting layer 212 is preferably relatively thin, perhaps 500 angstroms or less.

Figure 2:
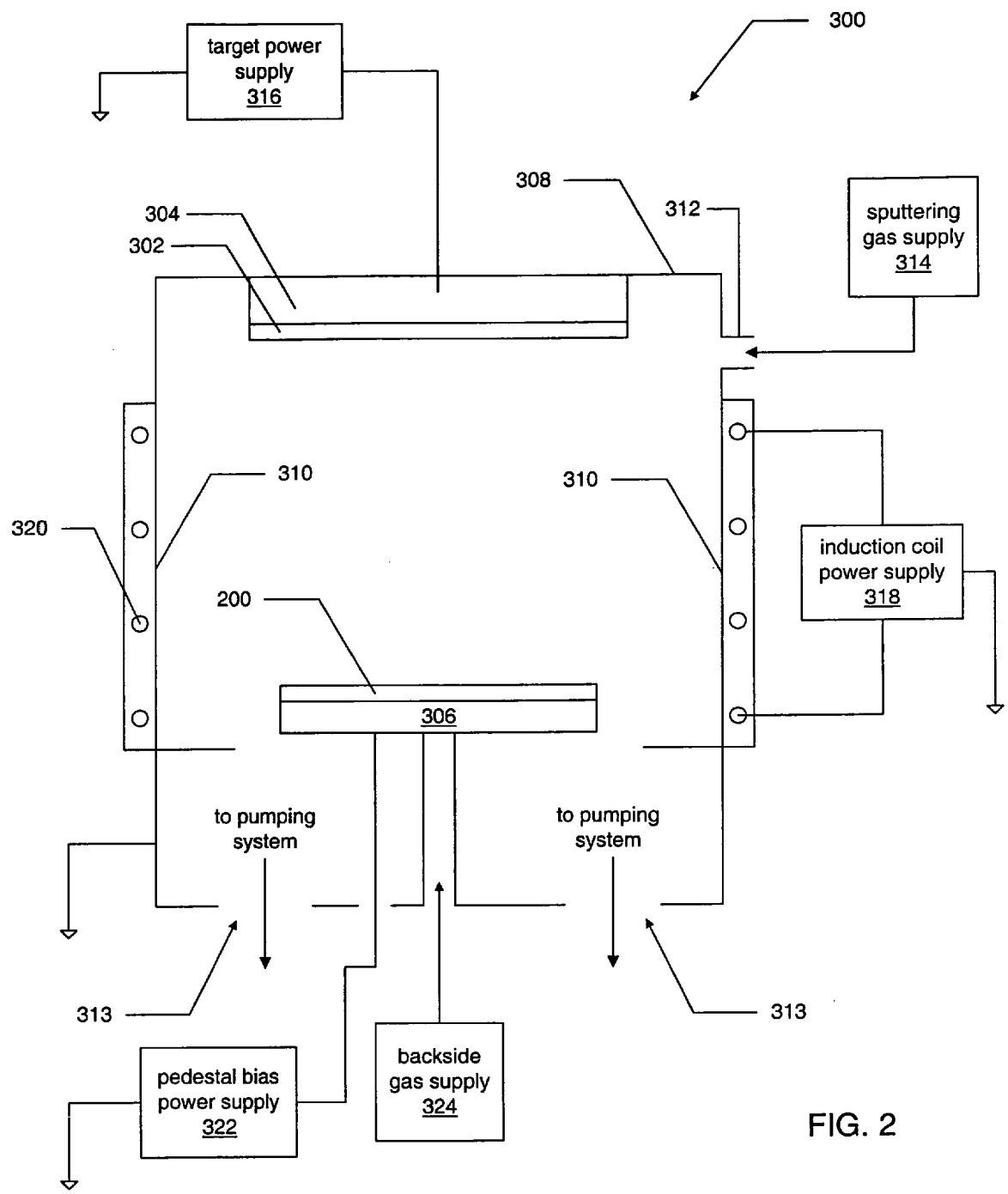
FIG. 2 is a schematic view of a wetting layer deposition chamber suitable for ion metal plasma depositing a wetting layer in an embodiment.

FIG. 2 presents a schematic view of a wetting layer deposition chamber in which ion metal plasma deposition 130 may be performed to deposit wetting layer 212. Wetting layer deposition chamber 300 may include a target 302, a pedestal 306, and an ionizing element 320. Microelectronic topography 200 may be placed upon pedestal 306 during deposition of a wetting layer using chamber 300. Wetting layer deposition chamber 300 is preferably configured to perform ion metal plasma deposition processes. Deposition chamber 300 may be obtained and/or configured as a chamber in a multi-chamber system such as the Endura PVD 5500, available from Applied Materials (Santa Clara, Calif.).

Target 302 is preferably attached to a target assembly 304 fixably coupled to a top wall 308 of the chamber. Target 302 is preferably composed of a metal having the desired composition as the wetting layer to be deposited. Preferably, target 302 is primarily composed of titanium. More preferably, target 302 is composed of relatively pure titanium or a high titanium percentage titanium alloy. Target assembly 304 preferably includes much of the structural and electric assembly related to the target. Target assembly 304 may also include magnetizing elements and mechanisms for operating such magnetizing elements. A target power supply 316 may be operably coupled to target assembly 304 for applying power to target 302. Target power supply is preferably configured to supply DC power to target 302 for ionizing and attracting sputtering gas atoms towards the target for sputtering metal off of the target during processing.

Ionizing element 320 is preferably arranged between target 302 and pedestal 306, and is preferably configured to ionize at least a portion of the metal atoms sputtered from target 302 before the metal ions reach pedestal 306. More preferably, ionizing element 320 includes induction coil 310 configured around wetting layer deposition chamber 300 and mounted near or on sidewalls 311 of the chamber. The induction coil may turn around the chamber any number of times. An induction coil power supply 318 may be operably coupled to the induction coil for applying power to the coil. Induction coil power supply 318 may supply RF power to the induction coil during processing. Induction coil power supply 318 may include a matching network.

Pedestal 306 is preferably located near a bottom of chamber 300 and may be adapted for supporting and retaining microelectronic topography 200 during processing. Pedestal 306 is preferably configured to be in gaseous communication with a backside gas supply 324 for applying a gas to the backside of microelectronic topography 200. Backside gas supply 324 is preferably configured to provide a thermally conductive gas, and more preferably an inert gas such as argon, to the backside of microelectronic topography 200. Pedestal 306 may be configured as an electrostatic or mechanical chuck. A pedestal bias power supply 322 may be operably coupled to pedestal 306 for applying a bias power to pedestal 306. Pedestal bias power supply 322 is preferably configured to supply a bias power to pedestal 306 for drawing ionized metal atoms sputtered from target 302 toward pedestal 306, and thus the surface of microelectronic topography 200, at an approximately perpendicular angle. The bias power is preferably AC.

Wetting layer deposition chamber 300 may include a gas inlet 312 for allowing gases to be introduced into the chamber. Gas supplies may be coupled to gas inlet 312 for introducing gases into the chamber. Preferably, a sputtering gas supply 314 is coupled to gas inlet 312 for introducing sputtering gases into chamber 300. The sputtering gases preferably include an inert gas such as argon.

Gas outlets 313 may be configured at a bottom of chamber 300 for exhausting gases and other substances from the chamber during processing. Gas outlets 313 may be connected to a pumping system (not shown) including one or more vacuum pumps. The vacuum pumps may be configured to create very high levels of vacuum in the chamber, possibly as high as $10^{-9}$ torr.

In an embodiment, once microelectronic topography 200 is transferred to wetting layer deposition chamber 300, it may be positioned above, and preferably upon, pedestal 306. Once the topography is secured on the pedestal, a sputtering gas may be introduced into the chamber from sputtering gas supply 314. The sputtering gas is preferably an inert gas such as argon. The flow rate of the sputtering gas into wetting layer deposition chamber 300 may vary depending on processing goals. The flow rate of the sputtering gas into wetting layer deposition chamber 300 is preferably set at about 3.25–6.75 standard cubic centimeters per second (sccm), more preferably about 4.5–5.5 sccm, and optimally about 5 sccm. A gas may also be flowed from backside gas supply 324 onto the backside of microelectronic topography 200. The backside gas used is preferably argon. The backside gas flow rate may be about 15 sccm, but may be altered subject to processing considerations. The pumping system is preferably actuated to evacuate gases and byproducts from the chamber to maintain a desired level of vacuum with the chamber.

Subsequently, sufficient power may be applied to various components of the wetting layer deposition chamber to deposit wetting layer 212 above microelectronic topography 200. Preferably, sufficient DC power may be applied to target 302 to induce the sputtering of metal atoms from the target and toward pedestal 306. The metal atoms sputtered from target 302 preferably primarily include titanium. Sufficient RF power may be applied to induction coil 310 for ionizing at least a portion of the metal ions sputtered from target 302. Applying the RF power to induction coil 310 preferably generates a medium to high density plasma containing the ionized metal atoms within chamber 300. A sufficient bias power may be applied to 306 pedestal to direct the metal ions towards microelectronic topography 200, and thus dielectric layer 202 and cavity 204, in a substantially perpendicular direction. Once the plasma is formed, a high electric field, or self bias, may develop in the boundary layer, or sheath, between the plasma and microelectronic topography 200. The plasma sheath may accelerate and collimate the metal ions at the surface of microelectronic topography 200. The bias applied to the pedestal 306, and thus to microelectronic topography 200, can control the field strength of the plasma sheath.

The amount of RF power applied to induction coil 310 largely determines the degree to which sputtered metal atoms are ionized. A lower RF power will ionize a smaller fraction of the sputtered metal atoms; a higher RF power will ionize a greater fraction of the sputtered metal atoms. The sputtered metal atoms that are not ionized are referred to as neutrals. While the ionized metal atoms will be directed toward the pedestal in a substantially perpendicular direction, significant directionality will generally not be imparted to the neutral atoms. Given the perpendicular orientation of the ionized metal atoms and the preferably substantially perpendicular orientation of cavity sidewalls 208, the amount of ionized metal atoms that deposit on cavity sidewalls 208 is typically significantly less than the amount that deposits on relatively flat cavity base 206 (above microelectronic topography lower portion 201). The majority of neutral atoms, however, will not impact the deposition surface at a perpendicular angle, and thus can deposit on substantially vertical surfaces such as sidewalls 208. Thus if too high a percentage of the deposited metal atoms are ionized, sufficient sidewall coverage with the wetting layer may not be obtained. Preferably, the present process incorporates an RF power level and other related parameters configured as to not ionize so many of the sputtered metal atoms that good sidewall coverage is sacrificed, but that still ionize enough to obtain good bottom coverage of the sputtered metal atoms.

Another problem addressed by the present process is the build-up of deposited metal on tapered portions 210 of the cavity sidewalls. During deposition, deposited metal can accumulate on the tapered portions of the cavity sidewalls to such an extent that the metal overhangs (or shadows) lower portions of sidewalls 208. When this happens, deposited metal cannot reach the shadowed sidewall portions, and thus these areas may not receive sufficient coverage. This is particularly a problem for the lower sidewall portions, which are perhaps the portions most likely to be shadowed.

To resolve these problems, the present method is preferably configured to deposit metal atoms with sufficient force to sputter previously deposited metal away from the ion impact area. The impact energy of the metal ions on the microelectronic topography is largely determined by the pedestal bias. A greater pedestal bias will increase the energy with which the ionized metals impact the deposition surface. The present process preferably incorporates a pedestal bias configured to deposit metal atoms with sufficient force to sputter previously deposited metal and reduce or prevent the problems discussed above. This feature allows for sputtering away of excess material on the tapered sidewall portions, and thus helps to prevent shadowing of other cavity sidewall portions. In addition, the sputtered metal ions may impact with previously deposited metal at the bottom of the trench with sufficient energy to resputter, or "splash," that metal onto lower cavity sidewalls 208. The pedestal bias, however, is preferably not set so high as to sputter away too much of the deposited material from areas that receive the greatest amount of direct ion impact (e.g., tapered portions 210 of the cavity sidewall and cavity base 206). In particular, the pedestal bias is preferably set below a level that would result in thinning of the wetting layer upon the tapered portions of the cavity sidewalls.

The present ion metal plasma deposition process preferably also incorporates a DC power to target 302 that allows production of a wetting layer that has excellent sidewall coverage even in small, high aspect ratio cavities. The DC power to target 302 greatly affects the rate of sputtering of the target, and thus the rate of deposition of metal over pedestal 306. The present process preferably balances the DC power applied to target 302 and the RF power applied to induction coil 310 at levels that enable the deposition of a wetting layer with good sidewall coverage. Preferably, the ratio between the DC power applied to target 302 and the RF power applied to induction coil 310 is about 1.3–5.4:1, and more preferably the ratio is about 2.2–3.3:1. Optimally, the ratio is about 2.67:1.

In a preferred embodiment, the DC power applied to target 302 is at least 2 kW. Preferably, the DC power applied to target 302 is about 2.6–5.4 kW, more preferably about 3.6–4.4 kW, and optimally about 4 kW. The RF power applied to induction coil 310 may be less than 2.5 kW. In addition, the RF power applied to induction coil 310 is preferably about 1.0–2.0 kW, more preferably about 1.35–1.65 kW, and optimally about 1.5 kW. The bias power applied to pedestal 306 may be between 100 and 200 W. More preferably, the bias power applied to the pedestal is about 135–165 W, and is optimally about 150 W. The length of time for which power is applied will depend on, among other things, the particular quantity applied and the thickness of the wetting layer to be deposited.

After a wetting layer 212 of the desired thickness has been formed, deposition of the wetting layer may be terminated. Referring back to FIG. 1, microelectronic topography 200 may then be transferred from wetting layer deposition chamber 300 into a bulk layer deposition chamber (step 140). Again, transfer of the microelectronic topography between chambers is preferably done under high vacuum. The microelectronic topography is preferably immediately transferred to the bulk metal deposition chamber after deposition of the wetting layer is complete. In any case, bulk metal layer deposition 150 is preferably the first metal deposition process performed on the microelectronic topography after depositing the wetting layer. That is, while other processing steps may be performed in between deposition of the wetting layer and the deposition of the bulk metal layer, e.g. cleaning processes, there are preferably no intervening processes between steps 130 and 150 in which a metal layer is deposited.

Once in the bulk metal layer deposition chamber, a bulk metal layer may be sputter deposited within the cavity for filling the cavity. The bulk metal layer is preferably deposited on upon the wetting layer. Deposition of the bulk layer is preferably performed in a single deposition chamber (the bulk metal layer deposition chamber) until the cavity is substantially filled. That is, deposition of the bulk metal layer is preferably undertaken until the level of metal within the lateral boundaries of the cavity is at least as high as the top of the cavity, even though there may be voids within the metal in the cavity. In addition, deposition of the bulk metal layer is not required to be performed continuously (e.g., deposition may be halted at some point), but it is preferred that the entire bulk metal layer be deposited in a single chamber. The bulk metal layer is may also be deposited above, and preferably upon, the upper surface of the wetting layer outside of the cavity.

Sputter depositing the bulk metal layer preferably includes sputter depositing, within a single chamber, substantially the entirety of the bulk metal layer. That is, substantially the entirety of a bulk metal layer used to form a substantially contiguous metallization structure (e.g., an interconnect line and underlying plug in a dual-Damascene scheme) is preferably sputter deposited in a single chamber. In an embodiment, the entirety of a bulk metal layer may include first cold sputtered and second hot sputtered portions of the bulk metal layer, as well as any capping layer deposited thereabove.

Sputter depositing of the bulk metal layer may potentially include a variety of sputtering processes in which the metal for the bulk metal layer is sputtered from a target, including, standard, collimated, and ion metal plasma. Preferably, however, sputter deposition is performed using by applying DC power to a target to induce sputtering of the target, and without filtering or biasing the sputtered atoms. The bulk metal layer is preferably primarily composed of aluminum. The bulk metal layer may also include materials intended to enhance the performance of the aluminum, such as copper and/or silicon.

Figure 7:
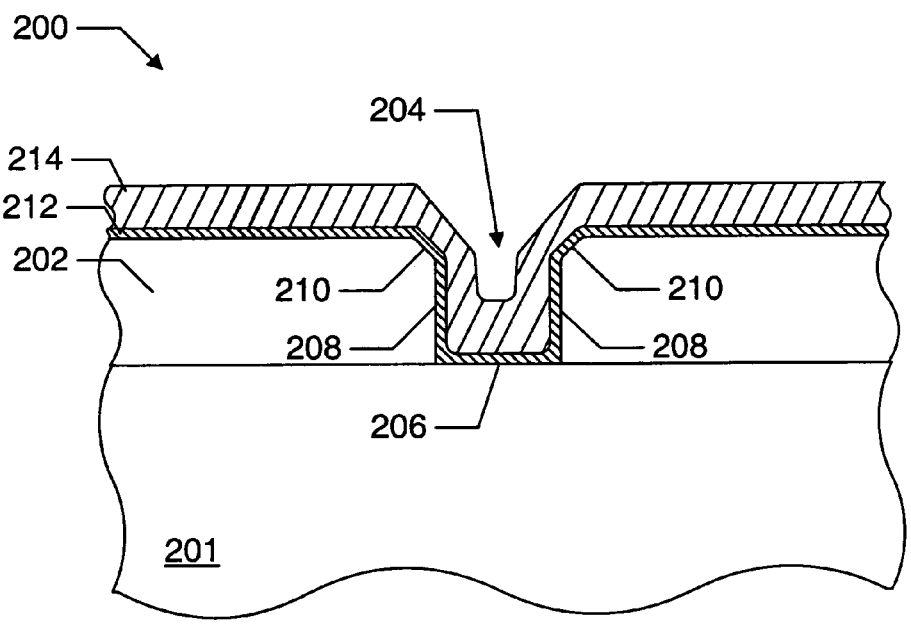
FIG. 7 is a partial cross-sectional view of the microelectronic topography, in which a first portion of a bulk metal layer is cold sputter deposited within the cavity and upon the wetting layer according to a processing step subsequent to FIG. 6.

FIG. 7 presents a cross-sectional view of microelectronic topography 200 after cold sputter depositing the first portion of the bulk metal layer into the cavity. In a preferred embodiment, first portion 214 of the bulk metal layer may be deposited above, and more preferably directly upon, wetting layer 212 both within and outside of cavity 204. First portion 214 of the bulk metal layer is preferably deposited by cold sputter deposition such that immediately after being deposited, the first portion of the bulk metal layer is not configured to significantly reflow. That is, while it may be made to reflow subsequently, it is not configured or capable of reflowing immediately after being deposited. After being deposited, the first portion of the bulk metal layer preferably does not fill cavity 204.

Figure 8:
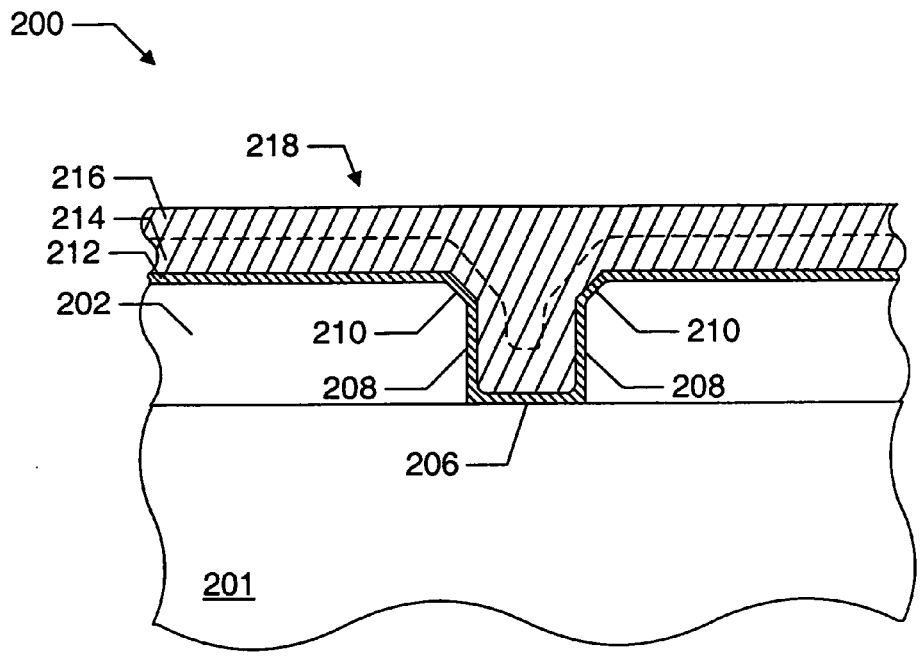
FIG. 8 is a partial cross-sectional view of the microelectronic topography, in which a second portion of the bulk metal layer is hot sputter deposited within the cavity and upon the first portion of the bulk metal layer such that after the hot sputter depositing is complete the upper surface of the bulk metal layer is substantially planar, according to a processing step subsequent to FIG. 7.

FIG. 8 presents a cross-sectional view of microelectronic topography 200 after hot sputter depositing second portion 216 of the bulk metal layer into cavity 204. Second portion 216 of the bulk metal layer may be deposited above, and more preferably directly upon, first portion 214 of the bulk metal layer both within and outside of cavity 204. Second portion 216 of the bulk metal layer is preferably deposited by hot sputter deposition such that immediately after being deposited, second portion 216 of the bulk metal layer is configured to significantly reflow. That is, second portion 216 is preferably at a temperature sufficiently high that it may be capable of reflowing immediately after being deposited. Second portion 216 of the bulk metal layer is preferably deposited such that it substantially fills the cavity.

Together, first portion 214 and second portion 216 preferably constitute bulk metal layer 218. (The line shown in the drawing between first portion 214 and second portion 216 is merely to illustrate the separation between the first portion and the second portion as deposited. It is not intended to represent the final position of these portions, nor it is intended to illustrate any definite interface between the portions in any final product.) Second portion 216 of the bulk metal layer is preferably deposited such that at least after reflowing of the bulk metal layer has stopped, the upper surface of the bulk metal layer is preferably substantially planar.

In an embodiment where the total metal thickness to be deposited (including the first portion of bulk metal layer, second portion of the bulk metal layer, and a third cap portion) is 8000 angstroms, first portion 214 of bulk metal layer 218 is preferably about 2500 angstroms thick and second portion 216 of bulk metal layer 218 is preferably about 1500 angstroms thick (leaving 4000 angstroms for the cap). In any case, first portion 214 of the bulk metal layer is preferably thicker than second portion 216. Furthermore, both first portion 214 of the bulk metal layer and the second portion 216 of the bulk metal layer are preferably significantly thicker than wetting layer 212 (more preferably, at least twice as thick).

Figure 3:
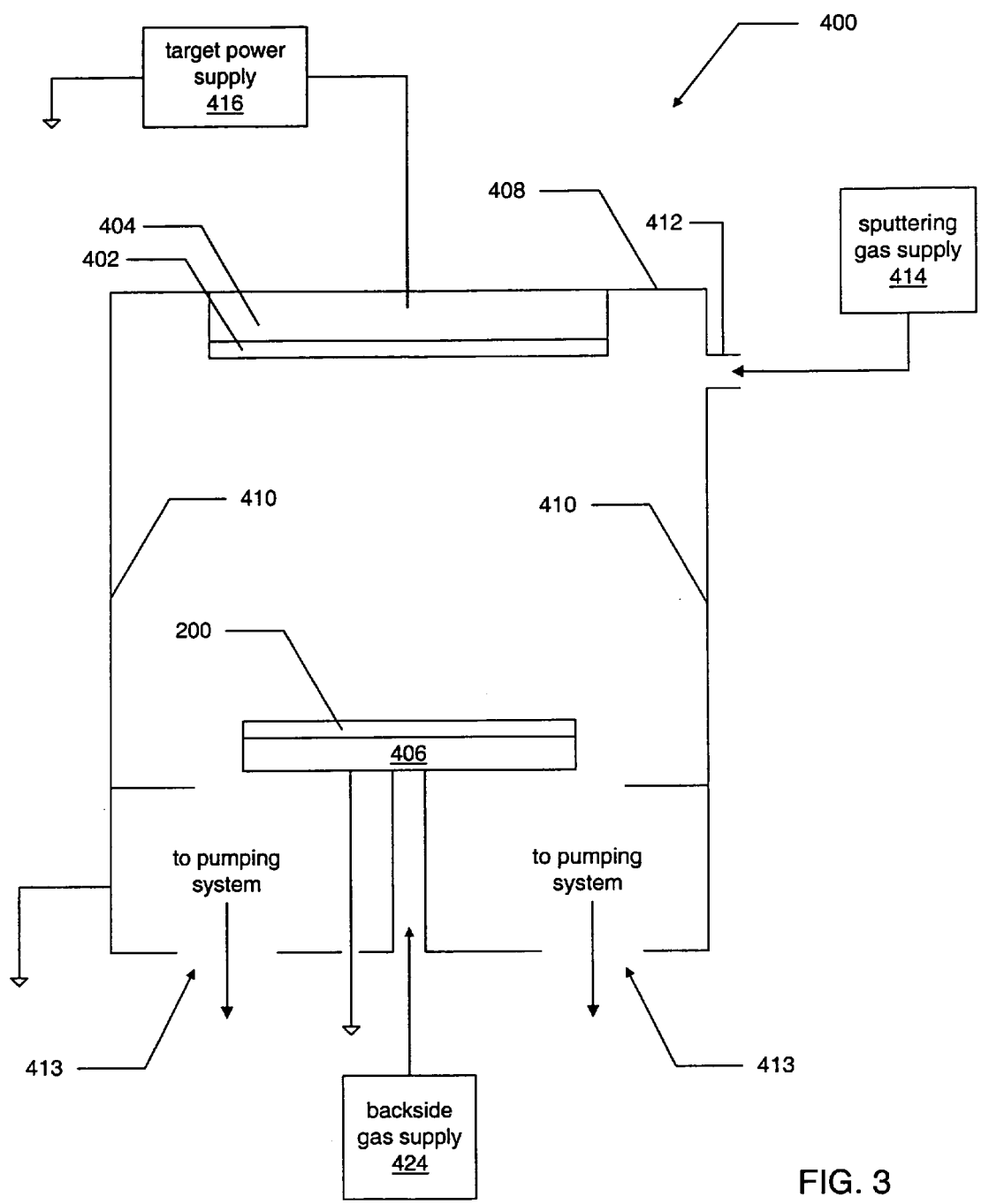
FIG. 3 is a schematic view of a bulk metal layer deposition chamber suitable for sputter depositing a bulk metal layer in an embodiment.

FIG. 3 presents a schematic view of a bulk metal layer deposition chamber in which bulk metal layer deposition 150 may be performed to deposit bulk metal layer 218 (including first bulk metal layer portion 214 and second bulk metal layer portion 216). Bulk metal layer deposition chamber 400 may include a target 402 and a pedestal 406. Microelectronic topography 200 may be placed upon pedestal 406 during deposition of a bulk metal layer using chamber 400. Bulk metal layer deposition chamber 400 is preferably configured to perform sputter deposition processes. Deposition chamber 400 may also be obtained and/or configured as a chamber in a multi-chamber system such as the Endura PVD 5500, available from Applied Materials (Santa Clara, Calif.).

Target 402 is preferably attached to a target assembly 404 fixably coupled to a top wall 408 of chamber 400. Target 402 is preferably composed of a metal having the desired composition as the bulk metal layer to be deposited. Preferably, target 402 is primarily composed of aluminum or an aluminum alloy. Target assembly 404 preferably includes the structural and electric assembly related to target 402. Target assembly 404 may also include magnetizing elements and mechanisms for operating such magnetizing elements. A target power supply 416 may be operably coupled to target assembly 404 for applying power to target 402. Target power supply 416 is preferably configured to supply DC power to target 402 for ionizing and attracting sputtering gas atoms towards the target for sputtering metal off of the target during processing.

Pedestal 406 is preferably located near a bottom of chamber 400 and is preferably adapted for supporting and retaining microelectronic topography during 200 processing. Pedestal 406 is preferably configured to be in gaseous communication with a backside gas supply 424 for applying a gas to the backside of microelectronic topography 200. Backside gas supply 424 is preferably configured to provide a thermally conductive gas, and more preferably an inert gas such as argon, to the backside of microelectronic topography 200. Pedestal 406 may be configured as an electrostatic or mechanical chuck. The pedestal may be grounded. Alternately, pedestal 406 may be operably coupled to an AC or DC power supply.

The bulk metal layer deposition chamber may include a gas inlet 412 coupled to one of chamber sidewalls 410 for allowing gases to be introduced into the chamber. Gas supplies may be coupled to gas inlet 412 for introducing gases into the chamber. Preferably, a sputtering gas supply is coupled to gas inlet 412 for introducing sputtering gases into chamber 400. The sputtering gases preferably include an inert gas such as argon.

Gas outlets 413 may be configured at a bottom of chamber 400 for exhausting gases and other substances from the chamber during processing. Gas outlets 413 may be connected to a pumping system (not shown) including one or more vacuum pumps. The vacuum pumps may be configured to create very high levels of vacuum in the chamber, possibly as high as $10^{-9}$ torr.

In an embodiment, once microelectronic topography 200 is transferred to bulk metal layer chamber 400, it may be positioned above, and preferably upon, pedestal 406. Cold sputtering of first portion 214 of the bulk metal layer may then begin. Once topography 200 is secured on pedestal 406, a sputtering gas may be introduced into chamber 400 from sputtering gas supply 414. The sputtering gas is preferably an inert gas such as argon. The flow rate of the sputtering gas into bulk metal layer deposition chamber 400 may vary depending on processing goals. The flow rate of the sputtering gas into bulk metal layer deposition chamber 400 is preferably about 25–55 sccm, more preferably about 35–45 sccm, and optimally about 40 sccm. During cold sputtering of first portion 214 of the bulk layer, backside gas is preferably not supplied to the backside of microelectronic topography 200. The pumping system is preferably actuated to evacuate gases and byproducts from chamber 400 to maintain a desired level of vacuum with the chamber.

Subsequently, sufficient power may be applied to various components of bulk metal layer deposition chamber 400 to deposit first portion 214 of the bulk metal layer above microelectronic topography 200. Preferably, sufficient DC power may be applied to target 402 to induce the sputtering of metal atoms from target 402 and toward pedestal 406. The metal atoms sputtered from the pedestal preferably primarily include aluminum or an alloy of aluminum. In a preferred embodiment, the DC power applied to target 402 during cold sputter depositing may be about 6–12 kW, more preferably about 8–10 kW, and optimally about 9 kW. The length of time for which power is applied will depend on, among other things, the particular quantity applied and the thickness of metal to be deposited. The supply of DC power to target 402 may be maintained for about 12 seconds in an embodiment.

After first portion 214 of the bulk metal layer has been deposited to a desired thickness, the deposition parameters of chamber 400 may be reconfigured to initiate hot sputtering of second portion 216 of the bulk metal layer. Preferably, the flow rate of sputtering gas into chamber 400 is increased to about 70–130 sccm. More preferably, the flow rate of sputtering gas for the hot sputtering process into the chamber is set at about 90–110 sccm, and optimally at about 100 sccm. There is preferably no substantial (e.g., more than a few seconds) discontinuation of sputtering gas flow when shifting from the cold sputtering parameters to the hot sputtering parameters. In addition, backside flow of an inert gas is preferably initiated from backside gas supply 424. Preferably, about 36–44 sccm, and preferably about 40 sccm, of argon is flowed onto the backside of microelectronic topography 200.

The DC power applied to target 402 during hot sputter depositing is preferably reduced from the DC power applied during cold sputter depositing. The DC power to target 402 during hot sputtering of second portion 216 of bulk metal layer 218 is preferably set at about 260–540 W, more preferably at about 360–440 W, and optimally at about 400 W. The ramp-down of power when going from cold sputtering to hot sputtering is preferably undertaken without substantially diminishing the power applied to target 402. The hot sputtering process conditions are preferably maintained for significantly longer than the cold sputtering process conditions. In an embodiment, hot sputtering may be maintained for about 180 seconds. The pedestal temperature preferably increases from cold sputter depositing to hot sputter depositing; preferably, the pedestal temperature during hot sputter depositing is greater than 300° C. As noted above, second portion 216 of bulk metal layer 218 is preferably hot sputter deposited until cavity 204 is substantially filled.

It should be understood that hot sputtering may not begin in a technical sense (i.e., the deposited metal is still not configured to substantially reflow) until a short while after the actual process conditions are changed from those of hot sputtering to those of cold sputtering. It should be appreciated that regardless of the processing conditions used, the technical accuracy labels of the labels "hot" or "cold" sputtering may be determined by the behavior of a material, e.g., immediately after being deposited. As such, a portion of the material deposited during processing conditions that fall under the classification "hot sputtering" may actually be "cold" sputtered, and vice versa. Therefore, when referring to only the process conditions of deposition, the terms "hot sputtering" and "cold sputtering" are used merely for convenience.

In a preferred embodiment, a capping portion (not shown) of bulk metal layer 218 may then be deposited above the first and second portions of bulk metal layer 218. The capping portion is preferably used to obtain a desired overall thickness of deposited metal. The capping portion of bulk metal layer 218 may be deposited in a manner similar to first portion 214. That is, the capping portion of bulk metal layer 218 may be cold sputter deposited using processing parameters similar to that used to deposit first portion 214 of the bulk metal layer. Whether or not a capping layer is utilized, the final bulk metal layer may be planarized using, e.g., chemical mechanical polishing to obtain a desired level of planarity and/or thickness. After deposition of bulk metal layer 218, microelectronic topography 200 may undergo further processing. For example, additional layers levels of metallization structures may be formed, possibly using methods similar to those described above, and other processing steps may be taken as necessary or desired to form an integrated circuit.

Figure 9:
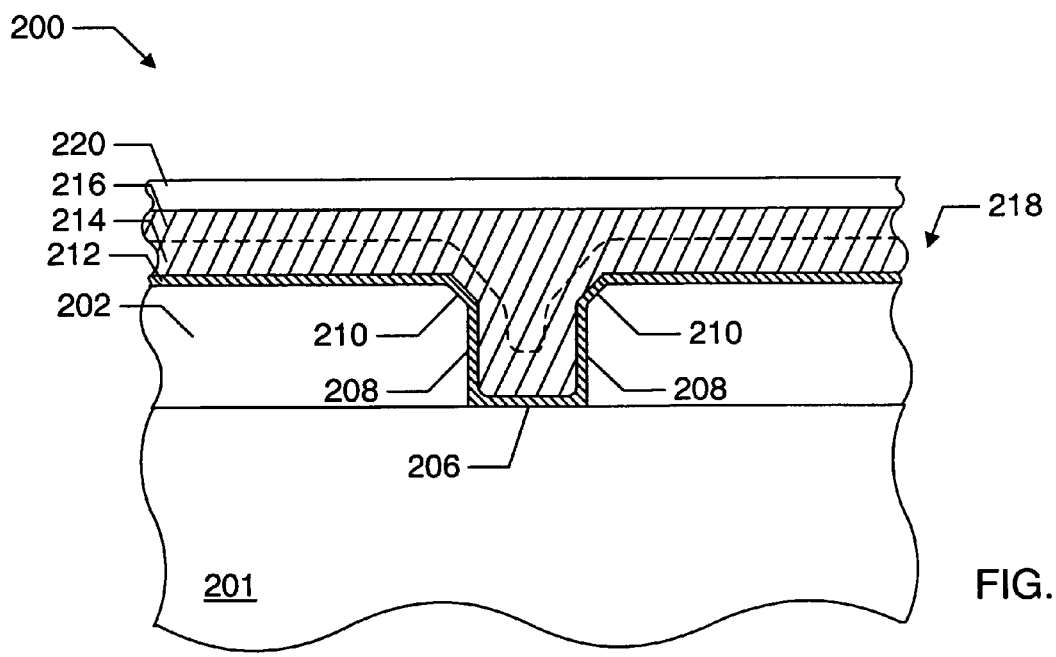
FIG. 9 is a partial cross-sectional view of the microelectronic topography, in which an insulating layer is formed above the bulk metal layer, according to a processing step subsequent to FIG. 8.

FIG. 9 presents a partial cross-sectional view of microelectronic topography in which an insulating layer is formed above bulk metal layer 218. Insulating layer 220 is preferably composed of a dielectric material, such a silicon dioxide. Insulating layer 220 may serve as a dielectric material for subsequent levels of metallization. Alternately, insulating layer 220 may serve as a passivation layer. Insulating layer 220 is preferably deposited upon the bulk metal layer 218. The capping metal layer (not shown) may be positioned between the second portion 216 of bulk metal layer 218 an insulating layer 220.

It will be appreciated by those skilled in the art having the benefit of this disclosure that this invention is believed to provide a method for fabricating a metallization structure in which a wetting layer is ion metal plasma deposited within a cavity defined in a dielectric layer and a bulk metal layer is subsequently sputter deposited within the cavity. Further modifications and alternative embodiments of various aspects of the invention will be apparent to those skilled in the art in view of this description. For example, the process described herein is not limited to use in formation of integrated circuits, but may be used for a variety of products that may be apparent to those skilled in the art in view of this description. In addition, the bulk metal layer may be deposited using a variety of sputter deposition configurations not shown in the description above. Still further, the metallization structure may be fabricated in a damascene or nondamascene process. It is intended that the following claims be interpreted to embrace all such modifications and changes and, accordingly, the specification and drawings are to be regarded in an illustrative rather than a restrictive sense.

What is claimed is:

1. A method for fabricating a metallization structure, comprising:
   ion metal plasma depositing a wetting layer within a cavity of a dielectric layer;
   applying a sufficient bias power to splash deposited metal at the bottom of the cavity to sidewalls of the cavity, wherein said applying occurs during said ion metal plasma depositing the wetting layer; and
   sputter depositing, within a single chamber, substantially an entirety of a bulk metal layer upon the wetting layer.

2. The method of claim 1, further comprising depositing an insulating layer above the bulk metal layer.

3. The method of claim 1, wherein said sputter depositing comprises sputter depositing the bulk metal layer within the cavity until the cavity is substantially filled.

4. The method of claim 1, wherein said wetting layer comprises titanium.

5. The method of claim 1, wherein the topography comprises a lower portion of a microelectronic topography below said dielectric layer, and wherein said ion metal plasma depositing a wetting layer comprises depositing the wetting layer upon sidewalls of the cavity and upon an upper surface of the microelectronic topography directly below the cavity.

6. The method of claim 1, wherein said ion metal plasma depositing a wetting layer comprises directing ionized metal atoms from a target toward the dielectric layer in a direction substantially perpendicular to the dielectric layer.

7. The method of claim 1, wherein said ion metal plasma depositing a wetting layer comprises:
   applying a sufficient DC power to a target to induce sputtering of metal atoms from the target and towards a pedestal below the topography, wherein the sputtered metal atoms comprise titanium;
   applying a sufficient RF power to an induction coil between the target and the pedestal to ionize at least a portion of the metal ions sputtered from the target; and
   applying the sufficient pedestal bias power to the pedestal to direct the ionized metal atoms towards the dielectric layer in a direction substantially normal to the dielectric layer.

8. The method of claim 1, wherein the cavity comprises a via in the dielectric layer and extending to a conductive region of the topography.

9. The method of claim 1, further comprising pre-cleaning said topography prior to said ion metal plasma depositing.

10. The method of claim 9, wherein said pre-cleaning comprises removing an upper portion of the dielectric layer to form tapered cavity sidewalls.

11. The method of claim 1, wherein the bulk metal layer comprises aluminum, and wherein the wetting layer comprises titanium.

12. A method for fabricating a metallization structure, comprising:
   in a first deposition chamber, ion metal plasma depositing a wetting layer consisting essentially of titanium within a cavity in a dielectric layer above a microelectronic topography;
   in a second deposition chamber, sputter depositing at a first temperature a first portion of a bulk metal layer comprising aluminum upon and in contact with the wetting layer; subsequently
   in said second deposition chamber, sputter depositing at a second temperature a second portion of the bulk metal layer within the cavity; and subsequently
   in said second deposition chamber, sputter depositing at a third temperature a third portion of the bulk metal layer upon said second portion, wherein said third temperature is lower than the second temperature.

13. The method of claim 12, wherein said sputter depositing at the first temperature comprises depositing the first portion of the bulk metal layer under conditions that do not significantly reflow the first portion of the bulk metal layer immediately after being deposited.

14. The method of claim 12, wherein said sputter depositing at the second temperature comprises depositing the second portion of the bulk metal layer under conditions that reflow the second portion of the bulk metal layer immediately after being deposited.

15. The method of claim 12, wherein said sputter depositing at the first temperature comprises applying a first DC power to a target in the second deposition chamber, and wherein said sputter depositing at a second temperature comprises applying a second DC power to the target, wherein said first DC power is greater than said second DC power.

16. The method of claim 12, wherein said sputter depositing at the second temperature further comprises depositing the second portion of the bulk metal layer upon the first portion of the bulk metal layer.

17. The method of claim 12, wherein said sputter depositing at the first temperature comprises depositing the first portion of the bulk metal layer upon the wetting layer, and wherein said sputter depositing at the second temperature substantially fills the cavity.

18. The method of claim 12, wherein said sputter depositing at the first temperature is the first deposition process performed after said ion metal plasma depositing a wetting layer.

19. The method of claim 12, wherein the second temperature is higher than the first temperature.

20. The method of claim 12, wherein said third portion comprises approximately 50% of said bulk metal layer.

21. A method for fabricating a metallization structure, comprising:
   etching a cavity comprising a base and opposing sidewalls within a dielectric of a topography;
   ion metal plasma depositing a wetting layer consisting essentially of titanium on and in contact with the base and the sidewalls of said cavity; and
   sputter depositing substantially an entirety of a bulk metal layer on and in contact with the wetting layer.

* * * * *